United States Patent
Xu

(10) Patent No.: US 10,248,834 B2
(45) Date of Patent: Apr. 2, 2019

(54) DISPLAY PANEL HAVING FINGERPRINT RECOGNITION AND DISPLAY APPARATUS

(71) Applicant: Shenzhen China Star Optoelectronics Technology Co., Ltd., Shenzhen, Guangdong (CN)

(72) Inventor: Xiangyang Xu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 210 days.

(21) Appl. No.: 15/102,759

(22) PCT Filed: May 19, 2016

(86) PCT No.: PCT/CN2016/082595
§ 371 (c)(1),
(2) Date: Jun. 8, 2016

(87) PCT Pub. No.: WO2017/177505
PCT Pub. Date: Oct. 19, 2017

(65) Prior Publication Data
US 2018/0096188 A1    Apr. 5, 2018

(30) Foreign Application Priority Data

Apr. 12, 2016 (CN) .......................... 2016 1 0225405

(51) Int. Cl.
*G06K 9/28* (2006.01)
*G06K 9/36* (2006.01)
(Continued)

(52) U.S. Cl.
CPC ..... *G06K 9/00087* (2013.01); *G06K 9/00013* (2013.01); *G09F 9/33* (2013.01); *H01L 27/323* (2013.01)

(58) Field of Classification Search
CPC .................. G06K 9/00013–2009/0006; H01L 27/3244–27/3276; G09G 3/3233–3/325
See application file for complete search history.

(56) References Cited

U.S. PATENT DOCUMENTS

2006/0256048 A1    11/2006 Fish et al.
2011/0109610 A1*    5/2011 Yamamoto ............. G09G 3/325
                                                                     345/211
(Continued)

FOREIGN PATENT DOCUMENTS

| CN | 104112120 A | 10/2014 |
| CN | 105355171 A | 2/2016 |
| KR | 20150024807 A | 3/2015 |

OTHER PUBLICATIONS

U.S. Appl. No. 12/708,521, filed Sep. 16, 2010, Jong Hwan Kim.
U.S. Appl. No. 14/959,070, filed Mar. 24, 2016, Jeffrey C. Konicek.

*Primary Examiner* — Brian Werner
(74) *Attorney, Agent, or Firm* — Andrew C. Cheng

(57) ABSTRACT

A display panel having a fingerprint recognition function and a display apparatus is provided in present invention. The display panel includes a display region and a fingerprint recognition region, the display region comprising a plurality of first pixel unit, the fingerprint identification region comprising a plurality of second pixel units, each second pixel units comprising a display unit and a fingerprint identification unit; wherein the pixel aperture area of the first pixel unit is equal to the pixel aperture area of the display unit plus the pixel aperture area of the fingerprint identification unit; by the gray scale voltage compensation of the pixel in the fingerprint recognition region makes the pixel luminance in the display region and the pixel luminance in the fingerprint identification region is the same to achieve ensuring safety of an electronic device while allowing luminance uniformity of the display panel.

9 Claims, 2 Drawing Sheets

(51) Int. Cl.
*G06K 9/00* (2006.01)
*G09F 9/33* (2006.01)
*H01L 27/32* (2006.01)

(56) References Cited

U.S. PATENT DOCUMENTS

| | | |
|---|---|---|
| 2015/0254491 A1 | 9/2015 | Mo et al. |
| 2016/0246147 A1 | 8/2016 | Chen et al. |
| 2016/0253541 A1* | 9/2016 | Yang ........................ G09G 3/32 382/124 |
| 2017/0005153 A1* | 1/2017 | Heo .................... H01L 27/3248 |
| 2017/0103706 A1* | 4/2017 | Yang .................... G09G 3/3258 |
| 2017/0289805 A1* | 10/2017 | Hong .................... G09G 3/3233 |
| 2017/0371213 A1 | 12/2017 | Wang et al. |

* cited by examiner

DISPLAY PANEL HAVING FINGERPRINT RECOGNITION AND DISPLAY APPARATUS

FIELD OF THE INVENTION

The present invention relates to the field of display technology, in particular, it relates to a display panel and a display apparatus with fingerprint recognition.

BACKGROUND OF THE INVENTION

The active organic light emitting display, AMOLED is made of using an organic semiconductor material, a thin film light-emitting device driving by the DC voltage. There is no need of the backlight in the AMOLED display technology, with a very thin coating of organic materials and the glass substrate, when a current is passed, these organic materials will emit light. The AMOLED displays is thinner and lighter, with larger viewing angle, and can significantly save power. The fingerprint identification technology can enhance the security of electronic devices that is important meaningful. Most of the current display does not have the function of fingerprint recognition, or by an additional independent fingerprint identification circuit to achieve fingerprint identification purposes, this will make the structure complicated, and raise costs.

SUMMARY OF THE INVENTION

The purpose of the present application is to provide display panel having a fingerprint recognition function and a display apparatus to achieve ensuring safety of an electronic device while allowing luminance uniformity of the display panel. In order to solve the problem mentioned above, one technology approach adapted by the present application is providing a display panel having a fingerprint recognition function, including: a display region and a fingerprint recognition region, the display region comprising a plurality of first pixel unit, the fingerprint identification region comprising a plurality of second pixel units, each second pixel units comprising a display unit and a fingerprint identification unit; wherein the pixel aperture area of the first pixel unit is equal to the pixel aperture area of the display unit plus the pixel aperture area of the fingerprint identification unit; by the gray scale voltage compensation of the pixel in the fingerprint recognition region makes the pixel luminance in the display region and the pixel luminance in the fingerprint identification region is the same.

Wherein the first and the second pixel unit comprising a pixel driving circuit, the pixel driving circuit comprising a controllable switch, a driving switch a storage capacitor and an organic light emitting diode; the control terminal of the controllable switch is connected to a scan line; the first terminal of the controllable switch is connected to a data line; the second terminal of the controllable switch is connected to a control terminal of the driving switch; the first terminal of the driving switch is connected to a first voltage terminal; the second terminal of the driving switch is connected to the anode of the organic light emitting diode; the cathode of the organic light emitting diode is grounded; the storage capacitor is connected between the control terminal of the driving switch and the second terminal of the driving switch.

Wherein the controllable switch and the driving switch are N-MOS thin film transistors or P-type MOS thin film transistors; the control terminal, the first terminal and the second terminal of the controllable switch and the driving switch are respectively corresponding to the gate, drain and source of the MOS thin film transistor.

Wherein by the compensation of the gray scale voltage of the pixel in the fingerprint identification region, the following formula need to be satisfied:

$$V_{d2} = (V_{d1} - V_{th})\left(\frac{A_1}{A_2}\right)^{1/2\beta} + V_{th}$$

Wherein, A1 is the pixel aperture area of the pixel in the display region, A2 is the pixel aperture area of the fingerprint identification unit, β are constants; Vd1 is the gray scale voltage in the display region; Vd2 is the gray scale voltage in the fingerprint identification region; Vth is the threshold voltage of the driving switch T2 to compensate the gray scale voltage of the fingerprint identification region and makes the pixel luminance in the display region and the pixel luminance in the fingerprint identification region is the same.

Wherein β is depended on the material properties of the organic light emitting diode.

In order to solve the problem mentioned above, another technology approach adapted by the present application is providing a display apparatus, wherein the display apparatus comprising a display panel having a fingerprint recognition function, the display panel comprising: a display region and a fingerprint recognition region, the display region comprising a plurality of first pixel unit, the fingerprint identification region comprising a plurality of second pixel units, each second pixel units comprising a display unit and a fingerprint identification unit; wherein the pixel aperture area of the first pixel unit is equal to the pixel aperture area of the display unit plus the pixel aperture area of the fingerprint identification unit; by the gray scale voltage compensation of the pixel in the fingerprint recognition region makes the pixel luminance in the display region and the pixel luminance in the fingerprint identification region is the same Wherein the first and the second pixel unit comprising a pixel driving circuit, the pixel driving circuit comprising a controllable switch, a driving switch a storage capacitor and an organic light emitting diode; the control terminal of the controllable switch is connected to a scan line; the first terminal of the controllable switch is connected to a data line; the second terminal of the controllable switch is connected to a control terminal of the driving switch; the first terminal of the driving switch is connected to a first voltage terminal; the second terminal of the driving switch is connected to the anode of the organic light emitting diode; the cathode of the organic light emitting diode is grounded; the storage capacitor is connected between the control terminal of the driving switch and the second terminal of the driving switch.

Wherein the controllable switch and the driving switch are N-MOS thin film transistors or P-type MOS thin film transistors; the control terminal, the first terminal and the second terminal of the controllable switch and the driving switch are respectively corresponding to the gate, drain and source of the MOS thin film transistor.

Wherein by the compensation of the gray scale voltage of the pixel in the fingerprint identification region, the following formula need to be satisfied:

$$V_{d2} = (V_{d1} - V_{th})\left(\frac{A_1}{A_2}\right)^{1/2\beta} + V_{th}$$

Wherein, A1 is the pixel aperture area of the pixel in the display region, A2 is the pixel aperture area of the fingerprint identification unit, β are constants; Vd1 is the gray scale voltage in the display region; Vd2 is the gray scale voltage in the fingerprint identification region; Vth is the threshold voltage of the driving switch T2 to compensate the gray scale voltage of the fingerprint identification region and makes the pixel luminance in the display region and the pixel luminance in the fingerprint identification region is the same.

Wherein β is depended on the material properties of the organic light emitting diode.

The advantage of the present application is by comparing to the conventional technology, the display panel and the display apparatus having the fingerprint identification region. By having a display region and a fingerprint identification region in the display panel, the fingerprint identification region has dual functions of display and fingerprint identification. The pixel aperture area of the display region is equal to the pixel aperture area of the fingerprint identification region plus the pixel aperture area of the fingerprint identification region. By the gray scale voltage compensation of the pixel in the fingerprint recognition region makes the pixels in the display region and the fingerprint identification region emits the same luminance of light, in order to achieve ensuring safety of an electronic device while allowing luminance uniformity of the display panel.

BRIEF DESCRIPTION OF THE DRAWINGS

In order to more clearly illustrate the embodiments of the present application or prior art, the following figures will be described in the embodiments are briefly introduced. It is obvious that the drawings are merely some embodiments of the present application, those of ordinary skill in this field can obtain other figures according to these figures without paying the premise.

DETAILED DESCRIPTION OF PREFERRED EMBODIMENTS

Embodiments of the present application are described in detail with the technical matters, structural features, achieved objects, and effects with reference to the accompanying drawings as follows. It is clear that the described embodiments are part of embodiments of the present application, but not all embodiments. Based on the embodiments of the present application, all other embodiments to those of ordinary skill in the premise of no creative efforts obtained should be considered within the scope of protection of the present application.

Specifically, the terminologies in the embodiments of the present application are merely for describing the purpose of the certain embodiment, but not to limit the invention. Examples and the claims be implemented in the present application requires the use of the singular form of the book "an", "the" and "the" are intend to include most forms unless the context clearly dictates otherwise. It should also be understood that the terminology used herein that "and/or" means and includes any or all possible combinations of one or more of the associated listed items.

Figure 1:
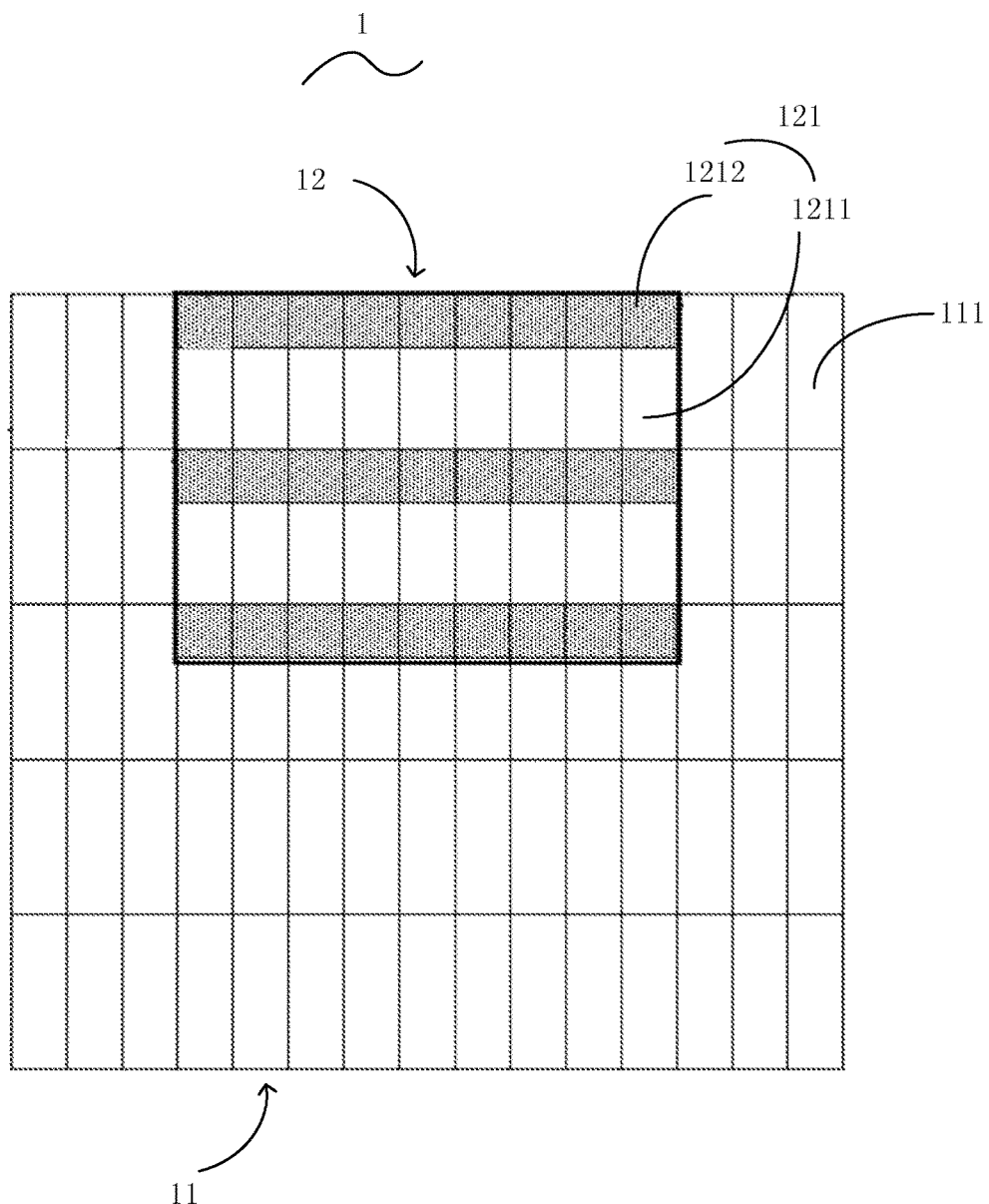
FIG. 1 illustrates a schematic structure of a display panel having a fingerprint recognition according to an embodiment of the present application.

Referring to FIG. 1, FIG. 1 illustrates a schematic structure of a display panel having a fingerprint recognition according to an embodiment of the present application. The display panel 1 includes a display region 11 and a fingerprint recognition region 12, the display region 11 includes a plurality of first pixel unit 111, the fingerprint identification region 12 includes a plurality of second pixel units 121, each second pixel units 121 includes a display unit 1211 and a fingerprint identification unit 1212. The pixel aperture area of the first pixel unit 111 is equal to the pixel aperture area of the display unit 1211 plus the pixel aperture area of the fingerprint identification unit 1212. By the gray scale voltage compensation of the pixel in the fingerprint recognition region 12 makes the pixel luminance in the display region and the pixel luminance in the fingerprint identification region is the same.

Figure 2:
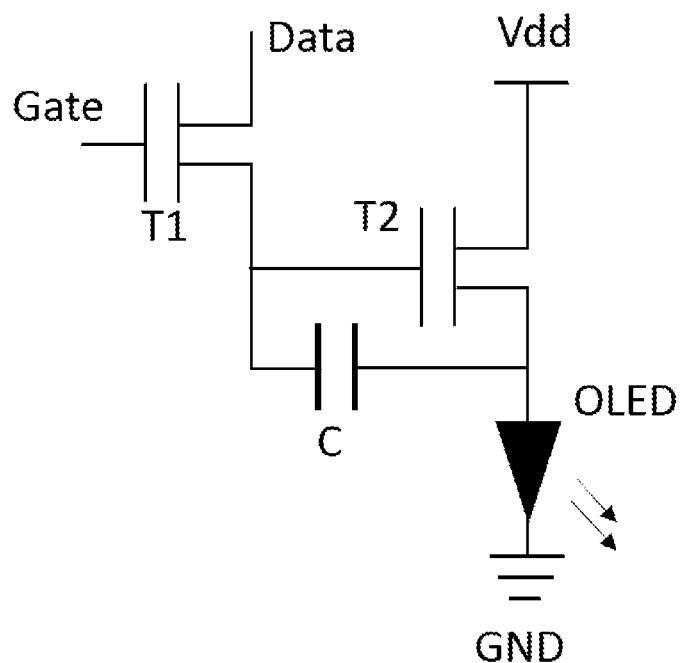
FIG. 2 is a circuit diagram of a pixel driving circuit.

Referring to FIG. 2, the first and the second pixel unit 111, 121 include a pixel driving circuit 13. The pixel driving circuit 13 includes a controllable switch T1, a driving switch T2, a storage capacitor C and an organic light emitting diode, OLED. The control terminal of the controllable switch T1 is connected to a scan line, Gate, the first terminal of the controllable switch T1 is connected to a data line, Data. The second terminal of the controllable switch T1 is connected to a control terminal of the driving switch T2. The first terminal of the driving switch T2 is connected to a first voltage terminal Vdd, the second terminal of the driving switch T2 is connected to the anode of the organic light emitting diode, OLED. The cathode of the organic light emitting diode, OLED is grounded. The storage capacitor C is connected between the control terminal of the driving switch T2 and the second terminal of the driving switch T2.

In the embodiment of the present application, the controllable switch T1 and the driving switch T2 are N-MOS thin film transistors or P-type MOS thin film transistors. The control terminal, the first terminal and the second terminal of the controllable switch T1 and the driving switch T2 are respectively corresponding to the gate, drain and source of the MOS thin film transistor. In other embodiments, the other types of switches can be choose as the controllable switch T1 and the driving switch T2 according to the need to realize the purpose of the present application.

By the compensation of the gray scale voltage of the pixel in the fingerprint identification region, the luminance of the pixel in the display region and the luminance of the pixel in the fingerprint identification region is the same. Firstly, the current I pass the organic light emitting diode OLED satisfies the following formula:

$$I = k(V_d - V_{th})^2 \qquad (1)$$

Wherein, Vd is the gate voltage of the driving switch T2, Vth is the threshold voltage of the driving switch T2, K is a constant.

The emission luminance L of the organic light emitting diode OLED satisfies the following formula:

$$L = \alpha A I^\beta \qquad (2)$$

Wherein, A is the pixel aperture area of the pixel of the organic light emitting diode OLED, α and β are constants;

In order to make the pixel luminance L1 in the display region 11 and the pixel luminance L2 In the fingerprint identification region 12 is the same in the same gray scale, the following formulas need to be satisfied:

$$L_1 = L_2 \qquad (3)$$

-continued $$A_1 I_1^\beta = A_2 I_2^\beta$$

$$\frac{I_2}{I_1} = \left(\frac{A_1}{A_2}\right)^{1/\beta}$$

$$\frac{I_2}{I_1} = \frac{(Vd_2 - V_{th})^2}{(Vd_1 - V_{th})^2} = \left(\frac{A_1}{A_2}\right)^{1/\beta}$$

$$V_{d2} = (V_{d1} - V_{th})\left(\frac{A_1}{A_2}\right)^{1/2\beta} + V_{th}$$

Wherein, Vd1 is the gray scale voltage in the display region 11, that is the gate voltage of the driving switching of T2; Vd2 is the gray scale voltage in the fingerprint identification region 12, that is the gate voltage of the driving switching of T2 to compensate the gray scale voltage of the fingerprint identification region 12 and makes the pixel luminance L1 in the display region 11 and the pixel luminance L2 in the fingerprint identification region 12 is the same.

Wherein, K is depended on the structure of the driving switch and the technology condition; α and β are depended on the material properties of the organic light emitting diode, OLED.

Figure 3:
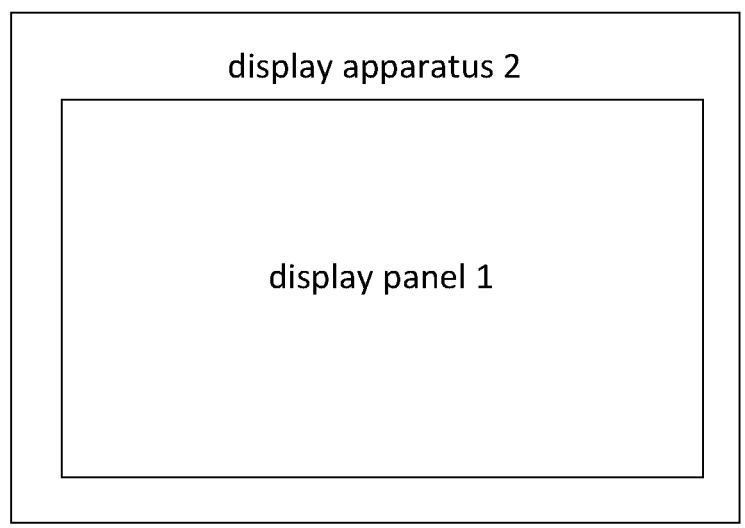
FIG. 3 is a schematic view of a display apparatus of the present application.

Referring to FIG. 3 is a schematic view of a display apparatus 2 of the present application. As illustrated in FIG. 3, the display apparatus 2 includes the display panel 1 having a fingerprint recognition function, in addition the display apparatus 2 further includes all the electronic components and functions in the conventional display apparatus. Since they are conventional technology, are not discussed here. By having the display region and the fingerprint identification region in the present display panel to achieve the display panel has a fingerprint identification and a display apparatus. The fingerprint identification region has dual functions of display and fingerprint identification. The pixel aperture area of the display region is equal to the pixel aperture area of the fingerprint identification region plus the pixel aperture area of the fingerprint identification region. By the gray scale voltage compensation of the pixel in the fingerprint recognition region makes the pixels in the display region and the fingerprint identification region emits the same luminance of light, in order to achieve ensuring safety of an electronic device while allowing luminance uniformity of the display panel.

Above are embodiments of the present application, which does not limit the scope of the present application. Any modifications, equivalent replacements or improvements within the spirit and principles of the embodiment described above should be covered by the protected scope of the invention.

What is claimed is:

1. A display panel having a fingerprint recognition function, comprising: a display region and a fingerprint recognition region, the display region comprising a plurality of first pixel unit, the fingerprint identification region comprising a plurality of second pixel units, each of the second pixel units comprising a display unit and a fingerprint identification unit; wherein the pixel aperture area of the first pixel unit is equal to the pixel aperture area of the display unit plus the pixel aperture area of the fingerprint identification unit; by the gray scale voltage compensation of the pixel in the fingerprint recognition region makes the pixel luminance in the display region and the pixel luminance in the fingerprint identification region is the same; the first and the second pixel unit comprising a pixel driving circuit, the pixel driving circuit comprising a controllable switch, a driving switch a storage capacitor and an organic light emitting diode; the control terminal of the controllable switch is connected to a scan line; the first terminal of the controllable switch is connected to a data line; the second terminal of the controllable switch is connected to a control terminal of the driving switch; the first terminal of the driving switch is connected to a first voltage terminal; the second terminal of the driving switch is connected to the anode of the organic light emitting diode; the cathode of the organic light emitting diode is grounded; the storage capacitor is connected between the control terminal of the driving switch and the second terminal of the driving switch; the controllable switch and the driving switch are N-MOS thin film transistors or P-type MOS thin film transistors; the control terminal, the first terminal and the second terminal of the controllable switch and the driving switch are respectively corresponding to the gate, drain and source of the MOS thin film transistor; by the compensation of the gray scale voltage of the pixel in the fingerprint identification region, the following formula need to be satisfied:

$$V_{d2} = (V_{d1} - V_{th})\left(\frac{A_1}{A_2}\right)^{1/2\beta} + V_{th}$$

wherein, A1 is the pixel aperture area of the pixel in the display region, A2 is the pixel aperture area of the display unit, β are constants; Vd1 is the gray scale voltage in the display region; Vd2 is the gray scale voltage in the fingerprint identification region; Vth is the threshold voltage of the driving switch T2 to compensate the gray scale voltage of the fingerprint identification region and makes the pixel luminance in the display region and the pixel luminance in the fingerprint identification region is the same.

2. A display panel having a fingerprint recognition function, comprising: a display region and a fingerprint recognition region, the display region comprising a plurality of first pixel unit, the fingerprint identification region comprising a plurality of second pixel units, each of the second pixel units comprising a display unit and a fingerprint identification unit; wherein the pixel aperture area of the first pixel unit is equal to the pixel aperture area of the display unit plus the pixel aperture area of the fingerprint identification unit; by the gray scale voltage compensation of the pixel in the fingerprint recognition region is made in accordance with a ratio of the pixel aperture area of the first pixel unit to the pixel aperture area of the display unit and makes the pixel luminance in the display region and the pixel luminance in the fingerprint identification region is the same;

wherein by the compensation of the gray scale voltage of the pixel in the fingerprint identification region, the following formula needs to be satisfied:

$$V_{d2} = (V_{d1} - V_{th})\left(\frac{A_1}{A_2}\right)^{1/2\beta} + V_{th}$$

wherein, A1 is the pixel aperture area of the pixel in the display region, A2 is the pixel aperture area of the display unit, β are constants; Vd1 is the gray scale voltage in the display region; Vd2 is the gray scale voltage in the fingerprint identification region; Vth is the threshold voltage of the driving switch T2 to compensate the gray scale voltage of the fingerprint identification region and makes the pixel luminance in the display region and the pixel luminance in the fingerprint identification region is the same.

3. The display panel having a fingerprint recognition function according to claim 2, wherein the first and the second pixel unit comprising a pixel driving circuit, the pixel driving circuit comprising a controllable switch, a driving switch a storage capacitor and an organic light emitting diode; the control terminal of the controllable switch is connected to a scan line; the first terminal of the controllable switch is connected to a data line; the second terminal of the controllable switch is connected to a control terminal of the driving switch; the first terminal of the driving switch is connected to a first voltage terminal; the second terminal of the driving switch is connected to the anode of the organic light emitting diode; the cathode of the organic light emitting diode is grounded; the storage capacitor is connected between the control terminal of the driving switch and the second terminal of the driving switch.

4. The display panel having a fingerprint recognition function according to claim 3, wherein the controllable switch and the driving switch are N-MOS thin film transistors or P-type MOS thin film transistors; the control terminal, the first terminal and the second terminal of the controllable switch and the driving switch are respectively corresponding to the gate, drain and source of the MOS thin film transistor.

5. The display panel having a fingerprint recognition function according to claim 3, wherein β is depended on the material properties of the organic light emitting diode.

6. A display apparatus, wherein the display apparatus comprising a display panel having a fingerprint recognition function, the display panel comprising: a display region and a fingerprint recognition region, the display region comprising a plurality of first pixel unit, the fingerprint identification region comprising a plurality of second pixel units, each of the second pixel units comprising a display unit and a fingerprint identification unit; wherein the pixel aperture area of the first pixel unit is equal to the pixel aperture area of the display unit plus the pixel aperture area of the fingerprint identification unit; by the gray scale voltage compensation of the pixel in the fingerprint recognition region is made in accordance with a ratio of the pixel aperture area of the first pixel unit to the pixel aperture area of the display unit and makes the pixel luminance in the display region and the pixel luminance in the fingerprint identification region is the same;

wherein by the compensation of the gray scale voltage of the pixel in the fingerprint identification region, the following formula need to be satisfied:

$$V_{d2} = (V_{d1} - V_{th})\left(\frac{A_1}{A_2}\right)^{1/2\beta} + V_{th}$$

wherein, A1 is the pixel aperture area of the pixel in the display region, A2 is the pixel aperture area of the display unit, β are constants; Vd1 is the gray scale voltage in the display region; Vd2 is the gray scale voltage in the fingerprint identification region; Vth is the threshold voltage of the driving switch T2 to compensate the gray scale voltage of the fingerprint identification region and makes the pixel luminance in the display region and the pixel luminance in the fingerprint identification region is the same.

7. The display apparatus according to claim 6, wherein the first and the second pixel unit comprising a pixel driving circuit, the pixel driving circuit comprising a controllable switch, a driving switch a storage capacitor and an organic light emitting diode; the control terminal of the controllable switch is connected to a scan line; the first terminal of the controllable switch is connected to a data line; the second terminal of the controllable switch is connected to a control terminal of the driving switch; the first terminal of the driving switch is connected to a first voltage terminal; the second terminal of the driving switch is connected to the anode of the organic light emitting diode; the cathode of the organic light emitting diode is grounded; the storage capacitor is connected between the control terminal of the driving switch and the second terminal of the driving switch.

8. The display apparatus according to claim 7, wherein the controllable switch and the driving switch are N-MOS thin film transistors or P-type MOS thin film transistors; the control terminal, the first terminal and the second terminal of the controllable switch and the driving switch are respectively corresponding to the gate, drain and source of the MOS thin film transistor.

9. The display apparatus according to claim 7, wherein β is depended on the material properties of the organic light emitting diode.

* * * * *